(12) United States Patent  (10) Patent No.: US 7,443,233 B2
Jang et al.  (45) Date of Patent: Oct. 28, 2008

(54) DC OFFSET CANCELLATION APPARATUS

(75) Inventors: Ji-Soo Jang, Yongin-si (KR);
Sang-Hoon Kang, Suwon-si (KR)

(73) Assignee: Samsung Electronics Co., Ltd.,
Suwon-si, Gyeonggi-do (KR)

( * ) Notice: Subject to any disclaimer, the term of this
patent is extended or adjusted under 35
U.S.C. 154(b) by 115 days.

(21) Appl. No.: 11/648,273

(22) Filed: Dec. 29, 2006

(65) Prior Publication Data

US 2007/0247218 A1 Oct. 25, 2007

(30) Foreign Application Priority Data

Apr. 25, 2006 (KR) .................... 10-2006-0037354

(51) Int. Cl.
*H03F 1/02* (2006.01)
(52) U.S. Cl. .................... 330/9; 330/124 R; 330/51
(58) Field of Classification Search .................... 330/9,
330/124 R, 51
See application file for complete search history.

(56) References Cited

U.S. PATENT DOCUMENTS

| 4,190,805 | A | * | 2/1980 | Bingham | ........................ 330/9 |
| 5,034,698 | A | * | 7/1991 | Moriyasu | ........................ 330/84 |
| 6,639,460 | B1 | * | 10/2003 | Botker | ........................ 330/9 |
| 6,784,750 | B2 | * | 8/2004 | Chiou et al. | ........................ 330/308 |
| 7,126,419 | B2 | * | 10/2006 | Miyasita | ........................ 330/69 |
| 7,132,883 | B2 | * | 11/2006 | Huijsing et al. | ........................ 330/9 |
| 2004/0166824 | A1 | | 8/2004 | Franca-Neto | |

FOREIGN PATENT DOCUMENTS

| JP | 2000-013159 | 1/2000 |
| JP | 2003-283266 | 10/2003 |
| KR | 2001-0047123 | 6/2001 |
| KR | 2001-0076615 | 8/2001 |
| KR | 1020050047214 | 5/2005 |

OTHER PUBLICATIONS

English Abstract for Publication No. 1020050047214.
English Abstract for Publication No. 2000-013159.
English Abstract for Publication No. 1020010047123.
English Abstract for Publication No. 1020010076615.
English Abstract for Publication No. 2003-283266.

* cited by examiner

*Primary Examiner*—Patricia Nguyen
(74) *Attorney, Agent, or Firm*—F. Chau & associates, LLC

(57) ABSTRACT

A DC offset canceling apparatus includes a main amplifier, a replica amplifier, a switch, and a storage unit. The replica amplifier has substantially the same structure as the main amplifier, receives an input signal having the same sign as that of a signal input to the main amplifier, and has an output connected to main amplifier with an opposite sign. The switch switches a signal input to the replica amplifier in response to a control signal. The storage unit is connected to an input terminal of the replica amplifier to maintain a DC value for a predetermined period of time when the switch is open.

12 Claims, 3 Drawing Sheets

DC OFFSET CANCELLATION APPARATUS

CROSS-REFERENCE TO RELATED PATENT APPLICATIONS

This application claims priority under 35 U.S.C. § 119 to Korean Patent Application No. 10-2006-0037354, filed on Apr. 25, 2006, the disclosure of which is hereby incorporated by reference in its entirety.

BACKGROUND OF THE INVENTION

1. Technical Field

The present disclosure relates to DC offset, and more particularly, to an apparatus for canceling a DC offset.

2. Discussion of the Related Art

In a typical direct conversion receiver, a DC offset is generated due to self-mixing of a local oscillator. The DC offset may deteriorate linearity and the noise figure may deteriorate as well, thus lowering the overall performance of a system. Thus, DC offset cancellation (DCOC) is an important design issue.

FIG. 1 shows an example of a timing diagram of the DCOC in a GSM (Global System for Mobile Communications) type direct conversion receiver. In a time division multiple access (TDMA) such as a GSM receiver, a signal is typically input after passing through a DC offset removing process using a DCOC control signal, as shown in FIG. 1. The DCOC operation is performed through a process of sensing and storing a DC offset voltage. After the DCOC operation is completed, the DC offset voltage is maintained until the next time slot.

Meanwhile, when the DC offset is canceled through the DCOC operation, the time for performing the DCOC is on the order of several tens of microseconds. It is often difficult to apply a structure to completely cancel an input DC offset using a DC shielding capacitor to the GSM type direct conversion receiver in which a switching operation is repeatedly performed at a cycle of several hundreds of microseconds through several milliseconds. For this reason, the GSM type direct conversion receiver generally adopts a feedback method.

FIG. 2 is a block diagram of a DC offset canceling circuit using a feedback method. Referring to FIG. 2, the DC offset canceling circuit includes a main amplifier 20 and a sensing/storing unit 21 forming a feedback loop at an output terminal of the main amplifier 20. The sensing/storing unit 21 operates in response to a DCOC control signal.

A DC offset voltage output from the main amplifier 20 is removed by the sensing/storing unit 21 and the feedback loop for a particular time, for example, the time during which the DCOC is performed. The sensing/storing unit 21 senses the DC offset voltage output from the main amplifier 20 and stores the sensed voltage. In the technology shown in FIG. 2, the feedback circuit or the feedback loop is a noise source and the noise figure characteristic deteriorates as a feedback gain is increased to improve the DCOC performance.

FIG. 3A is a block diagram of a DC offset canceling circuit using a feedback method. Referring to FIG. 3A, the DC offset canceling circuit uses an analog-to-digital converter (ADC) and a digital-to-analog converter (DAC). The DC offset canceling circuit includes an ADC, a DAC, and a register.

The DC offset canceling circuit converts a DC offset voltage to a digital signal using the ADC and stores the digital signal in the register. The DC offset canceling circuit supplies appropriate current to the circuit according to the digital signal, for example, an offset voltage, stored in the register using the DAC, thus canceling the DC offset.

FIG. 3B is a block diagram of a DC offset canceling circuit using a feedback method. Referring to FIG. 3B, the DC offset canceling circuit includes a trans-conductance (Gm) circuit, a capacitor C, and a switch. Since the switch is closed while the DCOC is performed, the capacitor C stores the DC offset voltage. The stored voltage is converted to current by the trans-conductance (Gm) circuit and the converted current is applied to the circuit so that the DC offset is canceled. The capacitance of the capacitor C must be sufficient to maintain the corrected DC voltage until the next time slot.

The technologies discussed above and shown in FIGS. 3A and 3B cancel the DC offset by adding or subtracting current to or from the circuit through the DC offset canceling circuit. In this case, the input of current by the feedback circuit and the DC offset canceling circuit itself become noise sources. As the feedback gain is increased to improve the DCOC performance, the amount of current used for the correction increases so that the noise figure characteristic is further deteriorated.

SUMMARY OF THE INVENTION

The present invention provides a DC offset canceling circuit of a GSM type direct conversion receiver which can prevent the deterioration of a noise figure characteristic due to the DC offset canceling circuit.

According to an exemplary embodiment of the present invention, a DC offset canceling apparatus comprises a main amplifier. A replica amplifier having substantially the same structure as the main amplifier receives an input signal having the same sign as that of a signal input to the main amplifier. An output is connected to main amplifier with an opposite sign. A switch switches a signal input to the replica amplifier in response to a control signal. A storage unit is connected to an input terminal of the replica amplifier to maintain a DC value for a predetermined period of time when the switch is open.

In a direct conversion receiver, DC offset is canceled because the DC offset due to the self-mixing of a local oscillator deteriorates the performance of the system. In a TDMA (time division multiple access) system such as a GSM receiver, the DC offset is generally canceled using a feedback method in an analog baseband. However, when the DC offset to be canceled is great, a noise figure of the overall system is considerably deteriorated. Thus, in some exemplary embodiments of the present invention, the DC offset is effectively canceled without considerable deterioration of a noise figure by using a replica amplifier structure.

BRIEF DESCRIPTION OF THE DRAWINGS

The exemplary embodiments of the present invention are described in detail with reference to the attached drawings in which.

DETAILED DESCRIPTION OF THE EXEMPLARY EMBODIMENTS

Figure 1:
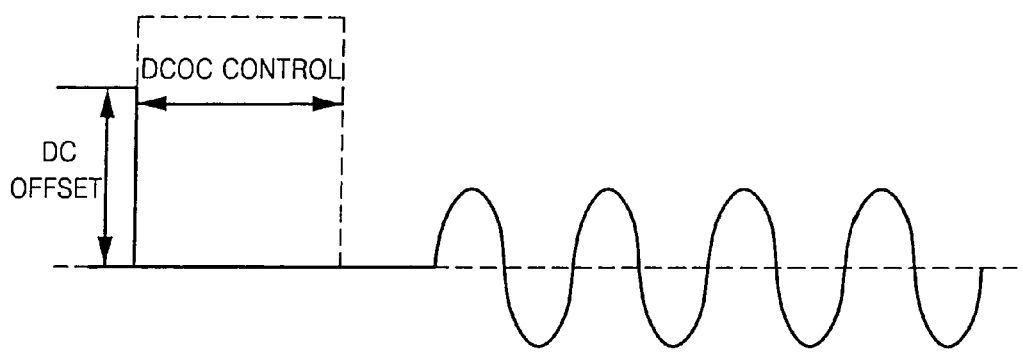
FIG. 1 is a timing diagram of a DCOC in a GSM type direct conversion receiver.
Figure 2:
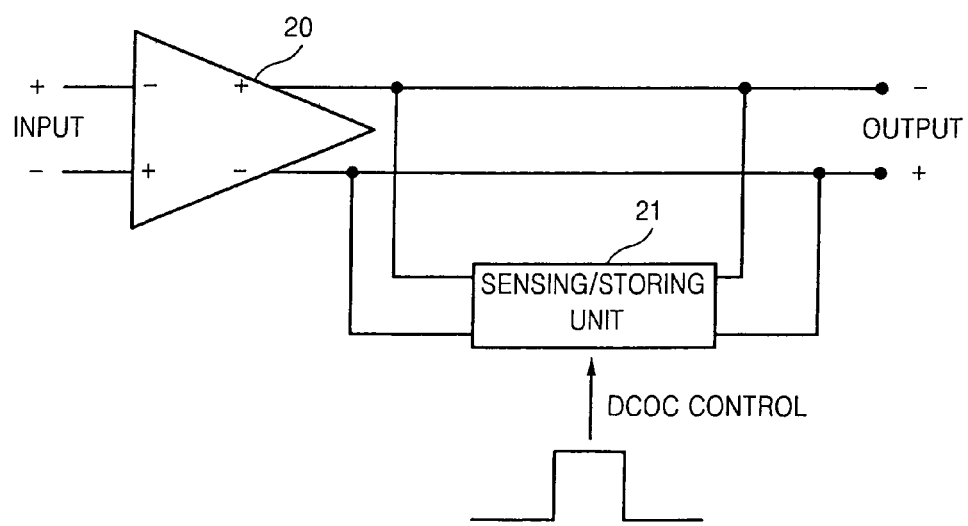
FIG. 2 is a block diagram showing the structure of a DC offset canceling circuit using a feedback method.
Figure 3A:
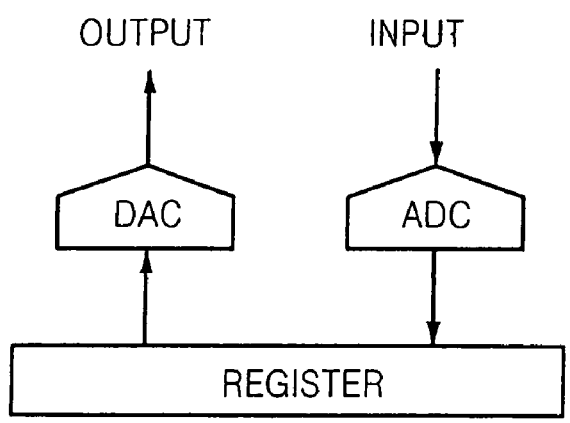
FIG. 3A is a block diagram showing the structure of a DC offset canceling circuit.
Figure 3B:
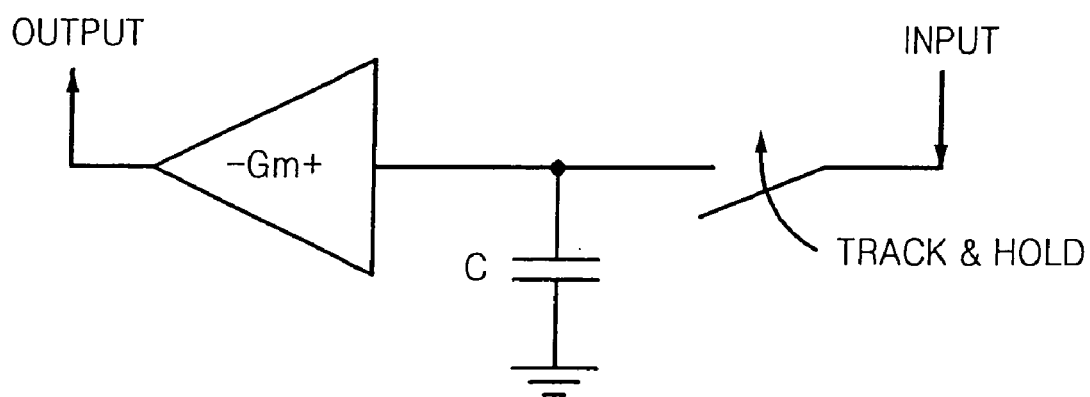
FIG. 3B is a block diagram showing the structure of a DC offset canceling circuit.
Figure 4:
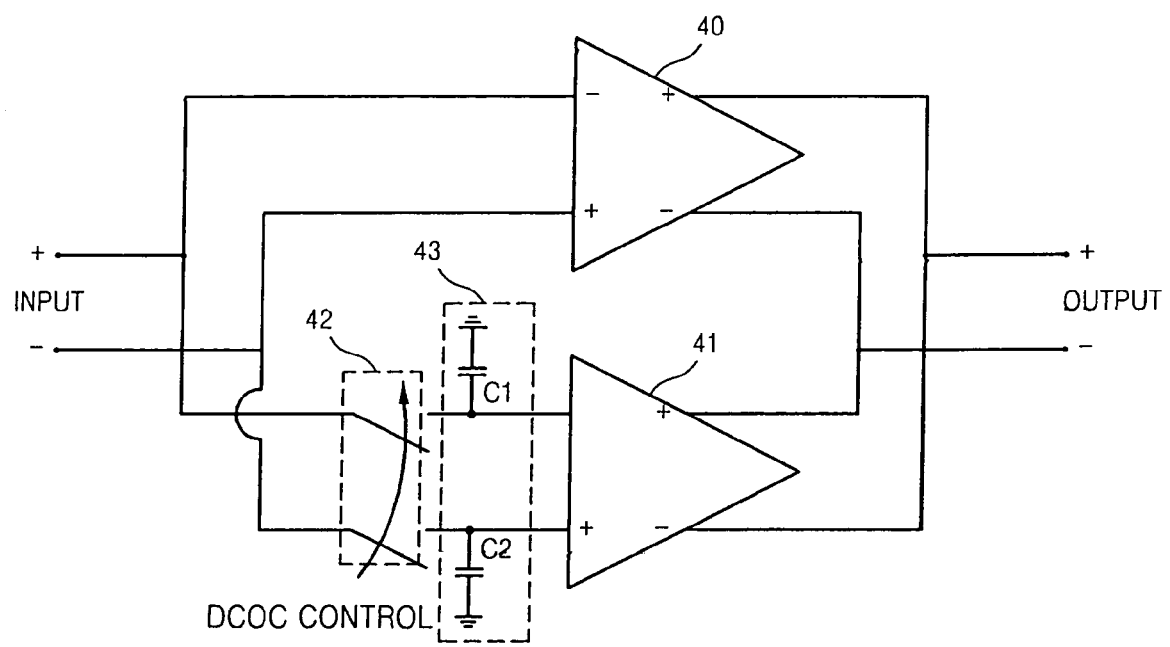
FIG. 4 is a circuit diagram of a DC offset canceling circuit using a replica amplifier according to an exemplary embodiment of the present invention.

Referring to FIG. 4, a DC offset canceling apparatus according to an exemplary embodiment of the present invention includes a main amplifier 40 and a replica amplifier 41 having substantially the same structure as the main amplifier 40. Both amplifiers 40 and 41 receive the same input signal(s). A switch 42 switches input signal(s) input to the replica amplifier 41 according to a DCOC control signal (DCOC control). A storage unit 43 arranged between the switch 42 and an input terminal of the replica amplifier 41 maintains a DC value after the DC offset canceling when the switch 42 is open, for a predetermined period of time.

The storage unit 43 includes capacitors C1 and C2 respectively connected to a (−) input terminal (inverted input) and a (+) input terminal (non-inverting input) of the replica amplifier 41. The capacitor C1 is connected between the (−) input terminal (inverted input) and ground while the capacitor C2 is connected between the (+) input terminal (non-inverting input) and ground.

The main amplifier 40 and the replica amplifier 41 have substantially the same structure and receive the same input signal(s). The output terminals (+) and (−) are complimentarily connected. For example, the (+) output terminal of the main amplifier 40 is connected to the (−) output terminal of the replica amplifier 41 and the (−) output terminal of the main amplifier 40 is connected to the (+) output terminal of the replica amplifier 41.

For example, when the input signals are differential input signals, a first signal can be input to the (−) input terminal of each of the main amplifier 40 and the replica amplifier 41 and a second signal can be input to the (+) input terminal of each of the main amplifier 40 and the replica-amplifier 41. Also, although the output signals of the main amplifier 40 and the replica amplifier 41 may be differential signals, exemplary embodiments of the present invention are not limited thereto.

The operation of the DC offset canceling apparatus is configured as shown in FIG. 4. The main amplifier 40 and the replica amplifier 41 are substantially the same circuits. The signs of the input signals of each amplifier 40 and 41 are the same. The signs of the output signals of each amplifier 40 and 41 are opposite to each other.

The switch 42 is short-circuited while the DCOC is performed. The DC offset of the (+) output of the main amplifier 40 becomes the DC offset of the (−) output of the replica amplifier 41 and the DC offset of the (−) output of the main amplifier 40 becomes the DC offset of the (+) output of the replica amplifier 41. For example, the DC bias of the (+) output terminal and the (−) output terminal are made identical at the output, regardless of the magnitude of the input DC offset voltage, so that, ideally, the DC offset can be completely canceled.

When the switch 42 is open after the DCOC is completed, a DC value corresponding to each of the capacitors C1 and C2 forming the storage unit 43 is stored and the stored DC value is maintained until the next time slot, for example, until the overall receiver is turned off. Meanwhile, the replica amplifier 41 maintains an ON state without being turned off and the switch 42 repeats short-circuiting and opening according to the control of the DCOC control signal.

The DC offset canceling apparatus according to an exemplary embodiment of the present invention senses the DC offset voltage and stores the sensed voltage and then cancels the DC offset voltage using the replica amplifier so that the canceled voltage is maintained until the next time slot. Thus, when the DC offset canceling apparatus configured as above is used, the DC offset voltage is output due to the mismatch of a main amplifier regardless of the size of the DC offset applied from the output of the main amplifier. Also, since there is no input of current due to feedback, the deterioration of a noise figure characteristic can be greatly reduced.

It will be understood by those skilled in the art that various changes in form and details may be made to the exemplary embodiments of the present invention described herein without departing from the spirit and scope of the disclosure.

For example, exemplary embodiments of the present invention can be applied to a GPRS (general packet radio services) method, an EDGE (enhanced data for global evolution) method, an EGPRS (enhanced GPRS) method, or a compact GPRS method. In addition, the DC offset canceling apparatus according to exemplary embodiments of the present invention can be applied to a direct conversion receiver or a low IF receiver.

As described above, the DC offset canceling apparatus according to exemplary embodiments of the present invention can effectively cancel a DC offset without deteriorating a noise figure and can thus increase system performance.

What is claimed is:

1. A DC offset canceling apparatus comprising:
    a main amplifier receiving an input signal at a main amplifier inverting input having a first sign and a main amplifier non-inverting input having a second sign;
    a replica amplifier comprising a structure that is substantially the same as a structure of the main amplifier, the replica amplifier receiving the input signal at a replica amplifier inverting input having the first sign and a replica amplifier non-inverted input having the second sign, and having an output connected to an output of the main amplifier, an output of the replica amplifier having a replica amplifier output sign that is the opposite of a main amplifier output sign of the output of the main amplifier;
    a switch switching the signal input to the replica amplifier in response to a control signal; and
    a storage unit connected to an input terminal of the replica amplifier to maintain a DC value for a predetermined period of time when the switch is open.

2. The apparatus of claim 1, wherein the storage unit comprises:
    a first capacitor connected to the non-inverting input of the replica amplifier; and
    a second capacitor connected to the inverting input of the replica amplifier.

3. The apparatus of claim 1, wherein DC offset is canceled as the switch is closed and the input signal is output through the main amplifier when the switch is open.

4. The apparatus of claim 2, wherein DC offset is canceled as the switch is closed and the input signal is output through the main amplifier when the switch is open.

5. The apparatus of claim 3, wherein the replica amplifier maintains an ON state when the switch is open.

6. The apparatus of claim 4, wherein the replica amplifier maintains an ON state when the switch is open.

7. A DC offset canceling apparatus comprising:
    a main amplifier receiving an input signal and outputting an output signal;
    a replica amplifier comprising a structure that is substantially the same as a structure of the main amplifier, the replica amplifier receiving the same input signal as the main amplifier, the replica amplifier having an output connected to an output of the main amplifier, wherein the output of the replica amplifier has an opposite sign as the output of the main amplifier;

a switch switching the input to the replica amplifier in response to a control signal; and a storage unit connected to an input terminal of the replica amplifier to maintain a DC value for a predetermined period of time when the switch is open.

8. The apparatus of claim 7, wherein the storage unit comprises:

a first capacitor connected to a non-inverting input of the replica amplifier; and a second capacitor connected to an inverting input of the replica amplifier.

9. The apparatus of claim 7, wherein DC offset is canceled as the switch is closed and the input signal is output through the main amplifier when the switch is open.

10. The apparatus of claim 8, wherein DC offset is canceled as the switch is closed and the input signal is output through the main amplifier when the switch is open.

11. The apparatus of claim 9, wherein the replica amplifier maintains an ON state when the switch is open.

12. The apparatus of claim 10, wherein the replica amplifier maintains an ON state when the switch is open.

* * * * *